United States Patent [19]
Nagami

[11] Patent Number: 6,037,718
[45] Date of Patent: Mar. 14, 2000

[54] DISPLAY UNIT HAVING TRANSISTOR OF ORGANIC SEMICONDUCTOR STACKED ON ORGANIC ELECTROLUMINESCENCE ELEMENT

[75] Inventor: Kimihiko Nagami, Tottori, Japan

[73] Assignee: Sanyo Electric Co., Ltd., Moriguchi, Japan

[21] Appl. No.: 09/017,058

[22] Filed: Jan. 27, 1998

[30] Foreign Application Priority Data

Jan. 31, 1997 [JP] Japan ................................. 9-019158

[51] Int. Cl.[7] ....................................... H01J 1/62
[52] U.S. Cl. .............................. 315/169.3; 315/169.4; 345/55
[58] Field of Search ...................... 315/169.1, 169.3, 315/169.4; 345/55, 76, 77

[56] References Cited

U.S. PATENT DOCUMENTS

| | | | |
|---|---|---|---|
| 5,404,074 | 4/1995 | Watanabe et al. | 315/169.1 |
| 5,528,397 | 6/1996 | Zavracky et al. | 315/169.3 |
| 5,661,371 | 8/1997 | Salerno et al. | 315/169.3 |
| 5,858,562 | 1/1999 | Utsugi et al. | 428/690 |
| 5,886,474 | 3/1999 | Asai et al. | 315/169.1 |

FOREIGN PATENT DOCUMENTS 4-125683  4/1992  Japan.

*Primary Examiner*—Don Wong
*Assistant Examiner*—Wilson Lee
*Attorney, Agent, or Firm*—Armstrong, Westerman, Hattori, McLeland and Naughton

[57] ABSTRACT

Disclosed is a display unit employing an organic electroluminescence element of an active matrix system, which has high picture quality and requires a low fabrication cost. The display unit comprises an organic electroluminescence element (14) and a bipolar transistor (11) stacked on the organic electroluminescence element (14). The organic electroluminescence element (14) comprises a hole transport layer (4), a luminescent layer (5) and an electron transport layer (6). The bipolar transistor (11) comprises a collector region layer (6), a base region layer (7) and an emitter region layer (8). The collector region layer (6) of the bipolar transistor (11) and the electron transport layer (6) of the organic electroluminescence element (14) are formed by a common single layer.

13 Claims, 8 Drawing Sheets

DISPLAY UNIT HAVING TRANSISTOR OF ORGANIC SEMICONDUCTOR STACKED ON ORGANIC ELECTROLUMINESCENCE ELEMENT

BACKGROUND OF THE INVENTION

1. Field of the Invention

The present invention relates to a display unit, and more particularly, it relates to a display unit employing an organic electroluminescence element.

2. Description of the Prior Art

Electroluminescence (EL) elements include an organic EL element employing an inorganic compound thin film of selenium or zinc as a luminescent material and an organic EL element employing an organic compound as a luminescent material.

The organic EL element has the following excellent characteristics:

(1) High luminous efficiency.

(2) Low driving voltage.

(3) Capable of displaying various colors such as green, red, blue and yellow by selecting the luminescent material.

(4) Capable of making sharp display with no backlight due to spontaneous luminescence.

(5) Wide viewing angle due to surface luminescence (6) Thin and lightweight.

(7) Capable of preparing a substrate from a soft material such as a plastic film due to a low maximum temperature in the fabrication process.

Due to the aforementioned excellent characteristics, the organic EL element is recently watched with interest as a display unit substituting for a cathode ray tube (CRT) or a liquid crystal display (LCD).

A dot matrix organic EL display unit for making display with dots which are arranged in the form of a matrix is of a simple matrix system or an active matrix system.

In the simple matrix system, only organic EL elements form a display panel of a display unit. This system is adapted to directly drive the organic EL elements of respective pixels which are arranged on the display panel in the form of a matrix from the exterior in synchronization with a scanning signal. If the number of scan lines increases, therefore, the driving time (duty) allotted to each pixel is reduced to lower the contrast.

In the active matrix system, on the other hand, a pixel driving element (active element) is provided for each of pixels which are arranged in the form of a matrix. The pixel driving element serves as a switch whose ON and OFF states are switched by a scanning signal. A data signal (display signal) is transmitted to an anode of each organic EL element through each pixel driving element which is in an ON state, thereby driving the organic EL element. When the pixel driving element thereafter enters an OFF state, the data signal applied to the anode of the organic EL element is stored in a storage capacitor in the state of charges, so that the storage capacitor continuously drives the organic EL element until the pixel driving element enters an ON state again. Even if the number of scan lines increases to reduce the driving time allotted to each pixel, therefore, driving of the organic EL element is not influenced and the contrast is not lowered. Thus, the active matrix system can make display with extremely higher picture quality as compared with the simple matrix system.

The active matrix system is roughly classified into a transistor type (three-terminal type) and a diode type (two-terminal type), depending on the types of the pixel driving elements. While the transistor type is hard to fabricate as compared with the diode type, the contrast or resolution can be readily increased. Thus, the transistor type can implement a high-definition organic EL display unit matching the CRT. The above description of the operation principle of the active matrix system mainly corresponds to the transistor type.

Japanese Patent Laying-Open No. 4-125683 (1992) proposes an active matrix system organic EL display unit employing a thin-film transistor (TFT) for each pixel driving element. The thin-film transistor employs a polycrystalline or amorphous silicon film as an active layer. In the organic EL display unit disclosed in the aforementioned gazette, each organic EL element and the TFT are arranged in line on a glass substrate. The TFT has a MOS structure.

The organic EL element requires a low driving voltage and a high driving current. In case of applying a transistor to each pixel driving element of an active matrix system organic EL display unit, therefore, the transistor must be capable of high-current driving. A MOS transistor has higher ON-state resistance as compared with a bipolar transistor. Such high ON-state resistance is disadvantageous for high-current driving. In case of a general bulk MOS transistor having a planar structure, the gate width must be extremely increased and the element area must be increased in order to reduce the ON-state resistance between the source and the drain. In a MOS structure TFT employing a polycrystalline or amorphous silicon film as an active layer, the ON-state resistance between the source and the drain exceeds that of the bulk MOS transistor having a planar structure, and hence the element area must be extremely increased for enabling high-current driving.

In the organic EL display unit disclosed in Japanese Patent Laying-Open No. 4-125683 formed by arranging each organic EL element and each TFT in line on the glass substrate, the element area of the TFT is so limited that it is difficult to sufficiently drive the organic EL element with a high current. When the driving current for the organic EL element is insufficient, it is impossible to obtain an organic EL display unit of high picture quality.

Further, a number of fabrication steps are required for obtaining the MOS structure TFT employing a polycrystalline or amorphous silicon film as an active layer. In addition, the polycrystalline or amorphous silicon film cannot be fabricated in the same process as an organic compound layer forming the organic EL element. Consequently, the organic EL display unit disclosed in Japanese Patent Laying-Open No. 4-125683 disadvantageously requires a high fabrication cost.

SUMMARY OF THE INVENTION

An object of the present invention is to provide a display unit employing an active matrix system organic electroluminescence element, which has high picture quality and requires a low fabrication cost.

The display unit according to the present invention comprises an organic electroluminescence element and a transistor of an organic semiconductor for driving the organic electroluminescence element. The organic electroluminescence element and the transistor are stacked with each other. According to the present invention, the transistor is employed as a pixel driving element, whereby an organic EL display unit having high picture quality can be obtained. Further, the organic electroluminescence element and the transistor of an organic semiconductor, which are stacked with each other, can be continuously fabricated in the same process, for reducing the fabrication cost.

Preferably, the transistor is a bipolar transistor including a collector region of an organic semiconductor. The organic electroluminescence element includes a plurality of organic compound layers. In a preferred embodiment of the present invention, the collector region of the bipolar transistor and a single organic compound layer of the organic electroluminescence element are formed by a common single layer. The bipolar transistor is capable of high-current driving, whereby a display unit of high picture quality can be obtained in this embodiment by driving the organic electroluminescence element with a high current. Further, the collector region of the bipolar transistor and a single organic compound layer of the organic electroluminescence element are formed by a common single layer, whereby the fabrication cost can be reduced.

The organic electroluminescence element typically comprises a luminescent layer and at least either one of a hole transport layer and an electron transport layer. Thus, the luminous efficiency can be increased to improve the brightness of the display unit.

In an embodiment of the present invention, the bipolar transistor includes an n-type collector region consisting of an organic semiconductor, and the organic electroluminescence element includes an n-type electron transport layer. The collector region and the electron transport layer are formed by the same layer. In another embodiment of the present invention, the bipolar transistor includes a p-type collector region consisting of an organic semiconductor, and the organic electroluminescence element includes a p-type hole transport layer. The collector region and the hole transport layer are formed by the same layer. According to each of these embodiments, the plane dimensions of the collector region of the bipolar transistor can be equalized with those of the organic electroluminescence element for increasing a collector current. Thus, the organic electroluminescence element can be readily driven with a high current. Further, no wire is required for connecting the collector region of the bipolar transistor with the organic electroluminescence element, whereby the structure is simplified, no loss results from wiring resistance in the driving current for the organic electroluminescence element, and power consumption can be reduced.

In another preferred embodiment of the present invention, a storage capacitor is provided between the collector region of the bipolar transistor and a single organic compound layer of the organic electroluminescence element. The storage capacitor includes a dielectric layer of silicon nitride, for example. When the bipolar transistor enters an ON state, a data signal is charged in the storage capacitor. In an OFF state of the bipolar transistor, the charged storage capacitor drives the organic electroluminescence element.

In still another preferred embodiment of the present invention, the bipolar transistor transmits a current-amplified data signal to the organic electroluminescence element. The bipolar transistor is preferably connected to a grounded-emitter circuit. Thus, current amplification by the bipolar transistor can be increased for driving the organic electroluminescence element with a high current.

When the hole transport layer of the organic electroluminescence element has a two-layer structure of first and second hole transport layers, an organic electroluminescence element having extremely high luminous efficiency can be obtained and the brightness of the organic EL display unit can be further improved.

In a more concrete structure, the display unit comprises an organic electroluminescence element including a plurality of organic compound layers formed on a transparent insulating substrate and a bipolar transistor including a plurality of organic semiconductor layers stacked on the organic electroluminescence element. The organic electroluminescence element includes a hole transport layer, a luminescent layer and an electron transport layer. The bipolar transistor includes a collector region layer, a base region layer and an emitter region layer.

In an embodiment, the bipolar transistor is an npn transistor, and the collector region layer and the electron transport layer are formed by a common single layer. In another embodiment, the bipolar transistor is a pnp transistor, and the collector region layer and the hole transport layer are formed by a common single layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
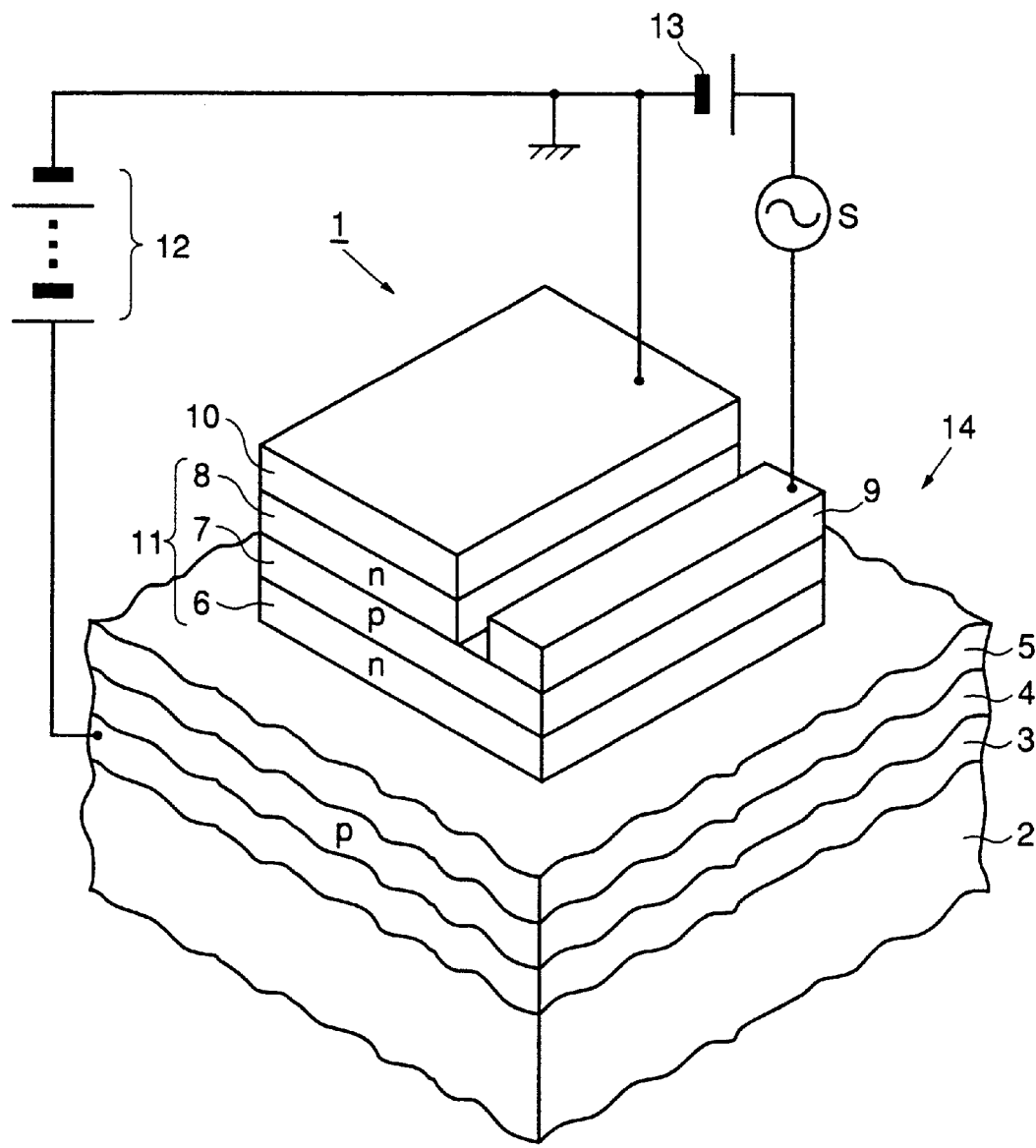
FIG. 1 is a partially fragmented perspective view showing an embodiment of the present invention.

Referring to FIG. 1, a pixel 1 of an organic EL display unit according to an embodiment of the present invention comprises a transparent insulating substrate 2, an anode 3, a hole transport layer 4, a luminescent layer 5, an electron transport layer 6, a p-type organic semiconductor layer 7, an n-type organic semiconductor layer 8 and a cathode 10, which are successively stacked with each other. A base electrode 9 is further formed on the p-type organic semiconductor layer 7.

The transparent insulating substrate 2 is made of glass or synthetic resin, for example. The anode 3 is formed by a transparent electrode of ITO (indium tin oxide) or the like. The hole transport layer 4 is made of a p-type organic semiconductor. The electron transport layer 6 is made of an n-type organic semiconductor. The luminescent layer 5 consists of an organic compound. The hole transport layer 4, the luminescent layer 5, the electron transport layer 6, the anode 3 and the cathode 10 form an organic EL element 14.

The electron transport layer 6 and the p-type organic semiconductor layer 7 form a p-n junction, while the p-type organic semiconductor layer 7 and the n-type organic semiconductor layer 8 form another p-n junction. In other words, these three layers 6, 7 and 8 form an npn transistor 11. The electron transport layer 6, the p-type organic semiconductor layer 7, the n-type organic semiconductor layer 8, the cathode 10 and the anode 3 serve as a collector region, a base region, an emitter region, an emitter electrode and a collector electrode respectively.

The npn transistor 11 is dc-biased by a grounded-emitter circuit. Namely, the n-type organic semiconductor layer 8 is grounded through the cathode 10. The electron transport layer 6 is connected to the plus side of a first dc power source 12 through the anode 3, the hole transport layer 4 and the luminescent layer 5. The p-type organic semiconductor layer 7 is connected to the plus side of a second dc power source 13 through the base electrode 9. A data signal (display signal) S is superposed on the power supply voltage of the dc power source 13.

Figure 2:
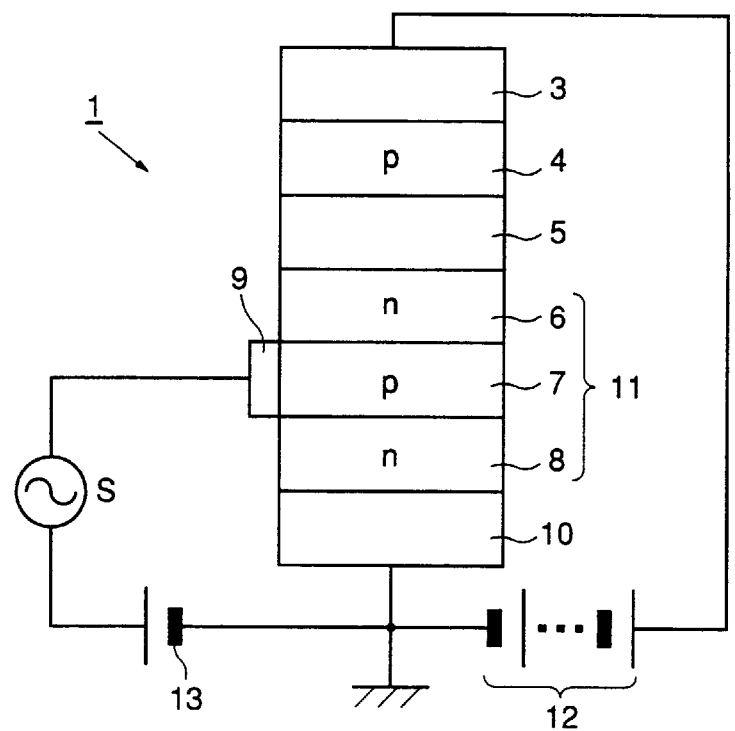
FIG. 2 is a model diagram showing the circuit structure of the embodiment shown in FIG. 1.

FIG. 2 is a typical circuit diagram of the embodiment shown in FIG. 1. Pixels 1 each having such a structure are arranged in the form of a matrix, thereby forming a display panel of the organic EL display unit.

The embodiment shown in FIGS. 1 and 2 attains the following functions/effects:

(1) In the organic EL element 14, holes injected from the anode 3 and electrons injected from the cathode 10 are recombined with each other in the luminescent layer 5, for exciting organic molecules forming the luminescent layer 5 and generating excitons. In the process of radiative deactivation of the excitons, the luminescent layer 5 emits light, which in turn is emitted to the exterior from the transparent anode 3 through the transparent insulating substrate 2. The hole transport layer 4 has functions of facilitating injection of the holes from the anode 3 and blocking the electrons injected from the cathode 10. The electron transport layer 6 has a function of facilitating injection of the electrons from the cathode 10.

(2) The npn transistor 11 serves as a pixel driving element (active element) for driving the organic EL element 14. The grounded-emitter circuit by the npn transistor 11 amplifies a small current of the data signal S which is inputted in the base electrode 9 and converts the same to a high current for supplying this current to the organic EL element 14. With the small current of the data signal S, therefore, the organic El element 14 can be readily driven with a high current.

When the npn transistor 11 enters an OFF state, the data signal S inputted in the organic EL element 14 is stored in a storage capacitor in the state of charges, for continuously driving the organic EL element 14 until the npn transistor 11 enters an ON state again. Even if the number of scan lines increases to reduce the driving time allotted to each pixel, therefore, driving of the organic EL element 14 is not influenced and the contrast is not lowered. Thus, an active matrix system organic EL display unit having high picture quality can be implemented.

(3) The organic EL element 14 and the npn transistor 11 are stacked with each other so that the electron transport layer 6 of the organic EL element 14 serves as the collector region of the npn transistor 11. In other words, the electron transport layer 6 of the organic EL element 14 and the collector region of the npn transistor 11 are formed by the same layer. Therefore, the plane dimensions of the collector region of the npn transistor 11 can be equalized with those of the pixel 1 for increasing a collector current, thereby readily driving the organic EL element 14 with a high current. Further, no wire is required for connecting the collector region of the npn transistor 11 with the organic EL element 14, whereby the structure is simplified and power consumption can be reduced with no loss resulting from wiring resistance in the driving current for the organic EL element 14.

(4) The npn transistor 11 is formed by the organic semiconductor layers 6, 7 and 8. Therefore, the npn transistor 11 can be continuously fabricated in the same process as the organic EL element 14, for reducing the fabrication cost.

Figure 3:
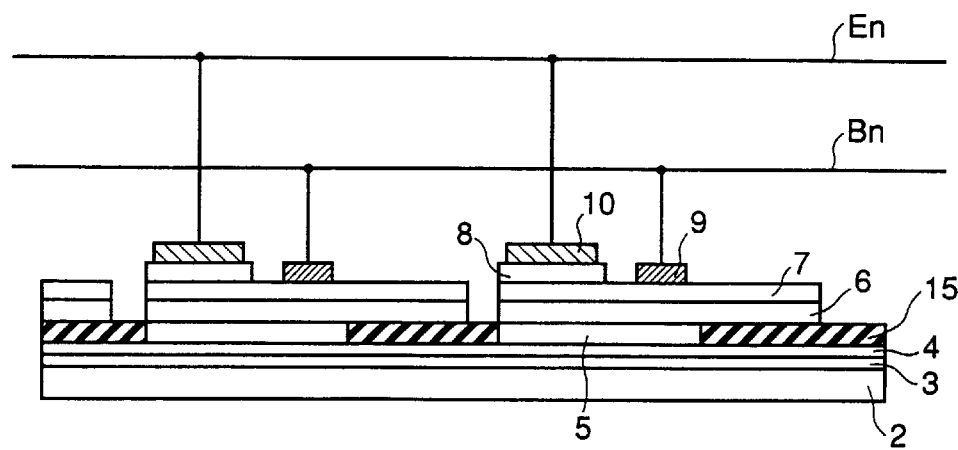
FIG. 3 is a typical sectional view showing another embodiment of the present invention.

FIG. 3 is a sectional view showing a display unit provided with storage capacitors according to another embodiment of the present invention. An anode 3 is formed by a transparent material such as an ITO film on the overall surface of a transparent insulating substrate 2 consisting of glass or synthetic resin. A hole transport layer 4 provided on the anode 3 is made of a p-type organic semiconductor. Luminescent layers 5 consisting of an organic compound are formed on the hole transport layer 4 in the form of islands in response to pixels of the display unit. Interlayer isolation films 15 consisting of silicon nitride (SiN) are formed between adjacent ones of the island luminescent layers 5. Further, electron transport layers 6 consisting of an n-type organic semiconductor are formed on the luminescent layers 5 and the interlayer isolation films 15. P-type organic semiconductor layers 7 are formed on the electron transport layers 6.

As shown in FIG. 3, an emitter region consisting of an n-type organic semiconductor layer 8 is formed on a part of each p-type organic semiconductor 7, and a cathode 10 is formed on the emitter region. A base electrode of a bipolar transistor is formed on another part of the p-type organic semiconductor layer 7.

The anode 3, each interlayer isolation film 15 and each electron transport layer 6 form an MIM (metal-insulator-metal) capacitor, thereby forming a storage capacitor.

Each electron transport layer 6 and each p-type organic semiconductor layer 7 form a p-n junction, and each p-type organic semiconductor layer 7 and each n-type organic semiconductor layer 8 form another p-n junction. In other words, these layers 6, 7 and 8 form an npn transistor 11. The electron transport layer 6, the p-type organic semiconductor layer 7, the n-type organic semiconductor layer 8, the cathode 10 and the anode 3 serve as a collector region, a base region, the emitter region, an emitter electrode and a collector electrode respectively.

Figure 4:
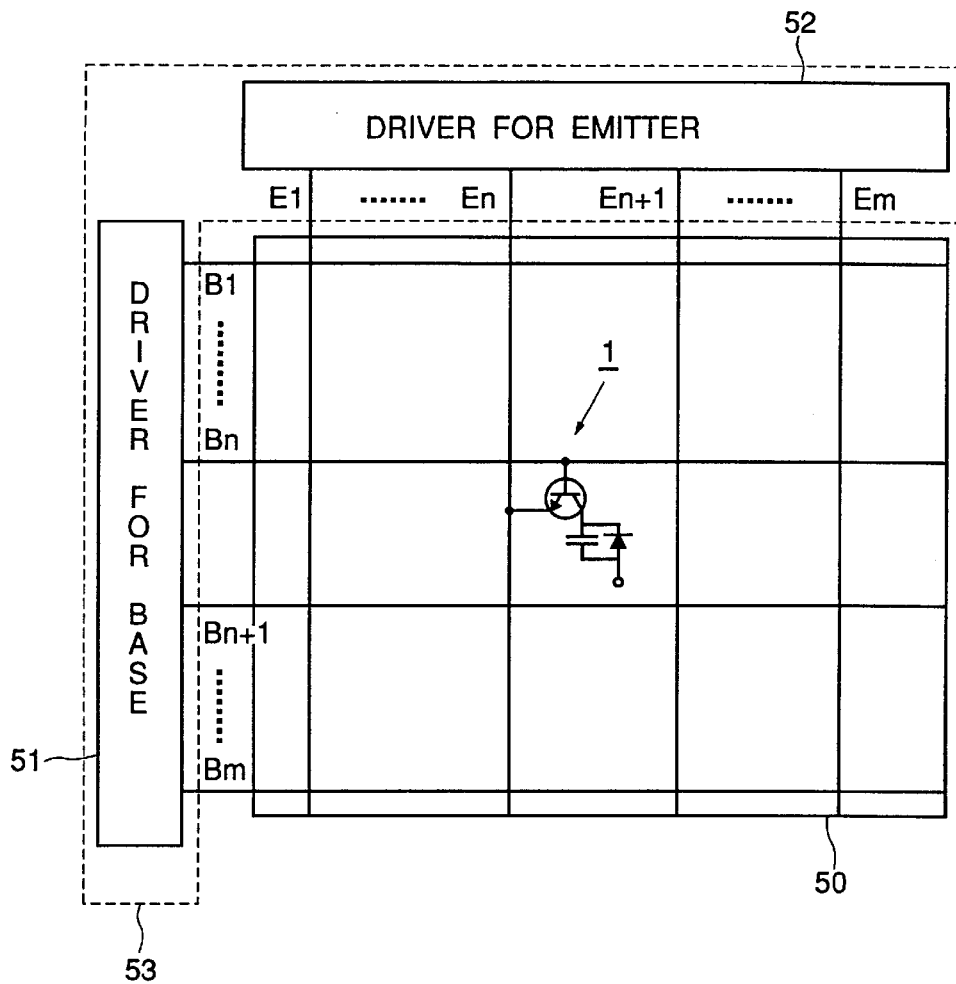
FIG. 4 is a model diagram showing the overall circuit structure of a display unit.
Figure 5:
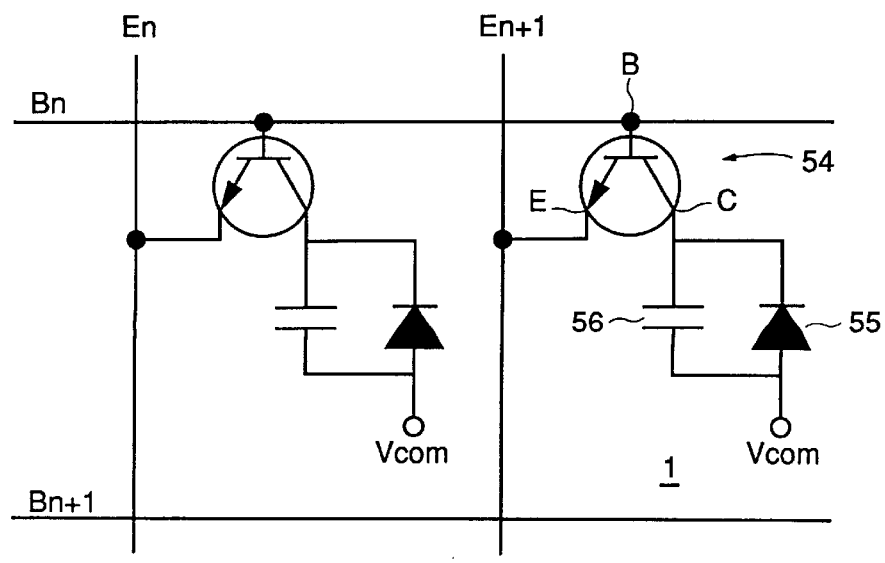
FIG. 5 is an equivalent circuit diagram of the display unit.

FIG. 4 is a block diagram of the active matrix system organic EL display unit according to the embodiment of the present invention, and FIG. 5 is an equivalent circuit diagram of pixels provided on the intersections between a base wire Bn and emitter wires En and En+1.

As shown in FIG. 4, base wires B1 to Bn and Bn+1 to Bm and emitter wires E1 to En and En+1 to Em are arranged on a display panel 50. The base wires B1 to Bm and the emitter wires E1 to Em intersect with each other, and pixels 1 are provided on the intersections respectively. Namely, the pixels 1 arranged in the form of a matrix form the display panel 50.

A base driver 51 is connected to the base wires B1 to Bm, for applying a base signal thereto. An emitter driver (data driver) 52 is connected to the emitter wires E1 to Em, for applying a data signal (video signal) thereto. These drivers 51 and 52 form a peripheral driving circuit part 53.

Referring to FIG. 5, base electrodes B of bipolar transistors 54 form each of the base wires B1 to Bm. Emitter electrodes E of the bipolar transistors 54 form each of the emitter wires E1 to Em.

A constant voltage Vcom is applied to a cathode of each organic EL element 55 and a first electrode of a storage capacitor 56 provided in parallel with the organic EL element 55. An anode of the organic EL element 5 and a second end of the storage capacitor 56 are connected to a collector electrode C of the bipolar transistor 54. The emitter electrode E and the base electrode B of the bipolar transistor 54 are connected to the emitter driver 52 and the base driver 51 respectively. Thus formed is each pixel 1 of the display unit.

Figure 6:
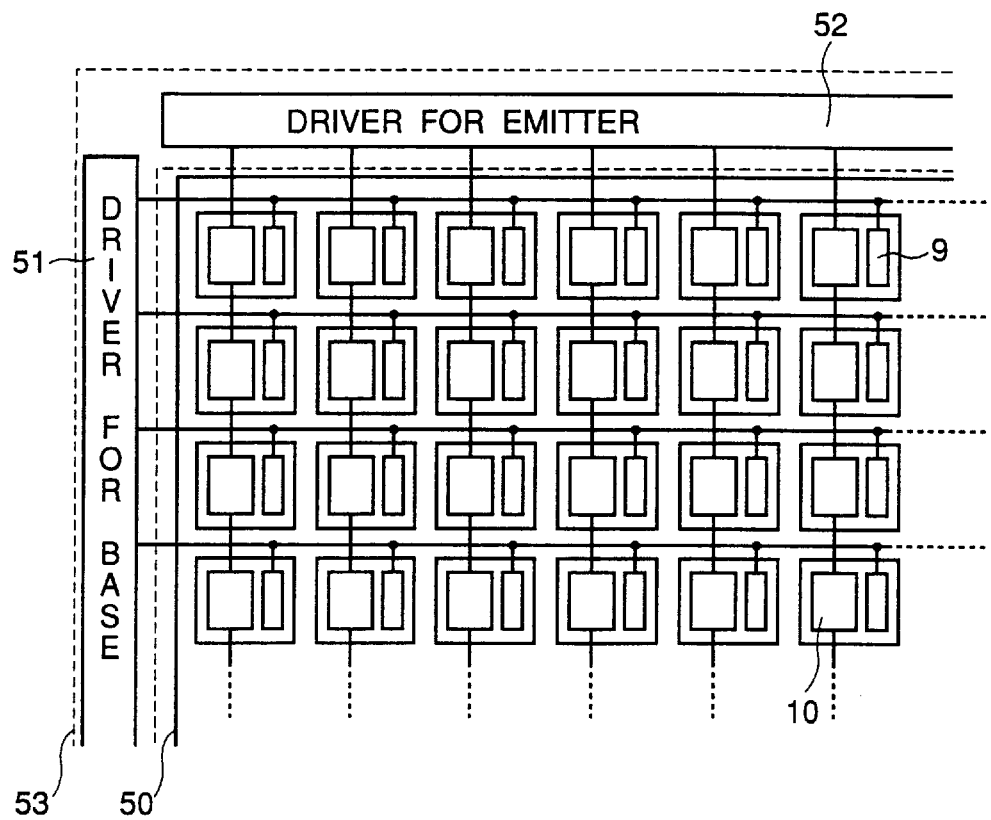
FIG. 6 is a model diagram showing the plane structure of the display unit.

FIG. 6 is a plan view of the display unit employing the organic EL elements 55. As shown in FIG. 6, the cathodes (emitter electrodes) 10 formed on parts of the electron transport layers 6 are connected to the emitter wires which are connected with the emitter driver 52. The base electrodes 9 formed on other parts of the electron transport layers 6 are connected to the base wires which are connected with the base driver 51.

Figure 7:
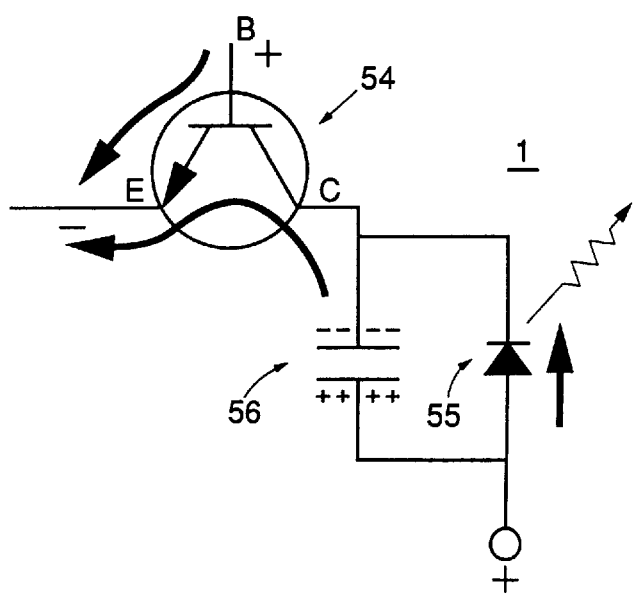
FIG. 7 is an equivalent circuit diagram with a bipolar transistor which is in an ON state.
Figure 8:
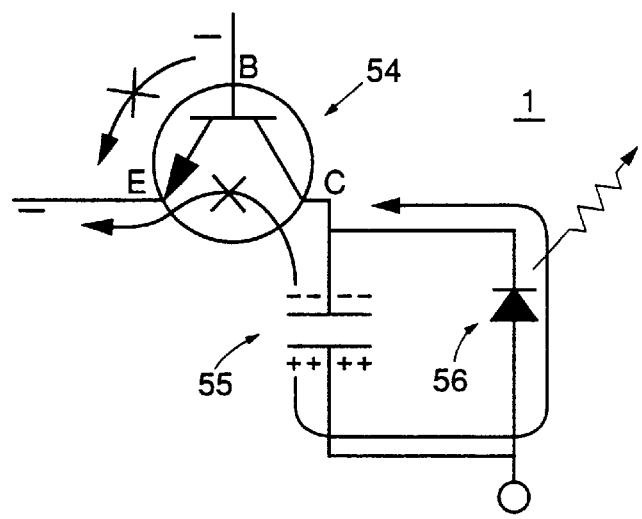
FIG. 8 is an equivalent circuit diagram with the bipolar transistor which is in an OFF state.

The embodiment shown in FIGS. 3 to 6 comprises the storage capacitors 56. Thus, the following functions/effects are attained:

When the base wire Bn is set at a positive voltage for applying this positive voltage to the base electrode B of the bipolar transistor 54 in each pixel 1 as shown in FIG. 7, the bipolar transistor 54 enters an On state. When the data signal is applied to the emitter wire En, an amplified current flows to the organic EL element 55, which in turn emits light. The storage capacitor 56 is charged at the same.

When the base wire Bn is set at a negative voltage for applying this negative voltage to the base electrode B of the bipolar transistor 54, the bipolar transistor 54 enters an OFF state. Consequently, the part between the collector electrode C and the emitter electrode E also enters an OFF state, whereby the organic EL element 56 is driven with the power charged in the storage capacitor 55 until a next signal is inputted in the base electrode B. Thus, the organic EL element 56 continuously emits light in the OFF state of the bipolar transistor 54. However, the power charged in the storage capacitor 55 is relatively small and hence the organic EL element 56 gradually becomes dark to emit no light if the bipolar transistor 54 remains in the OFF state for a long time. If no storage capacitor 55 is provided, the organic EL element 56 emits light only when the bipolar transistor 54 enters an ON state and hence the display of the organic EL element 56 becomes dark to flicker the screen. According to this embodiment, however, the organic EL element 56 can emit light to some extent until the next signal is inputted due to the presence of the storage capacitor 55, whereby the display of the organic EL element 56 becomes bright to reduce flicker of the screen.

According to the aforementioned embodiment, the organic EL element 56 is driven by charges stored between the anode 3 and the cathode 10 to continuously emit light even if the number of the base wires B1 to Bm (scan lines) increases to reduce the driving time allotted to each pixel 1, whereby the contrast of images displayed on the display panel 50 is not lowered. Therefore, the active matrix system organic EL display unit according to this embodiment can make display in higher picture quality as compared with a simple matrix system organic EL display unit.

Figure 9:
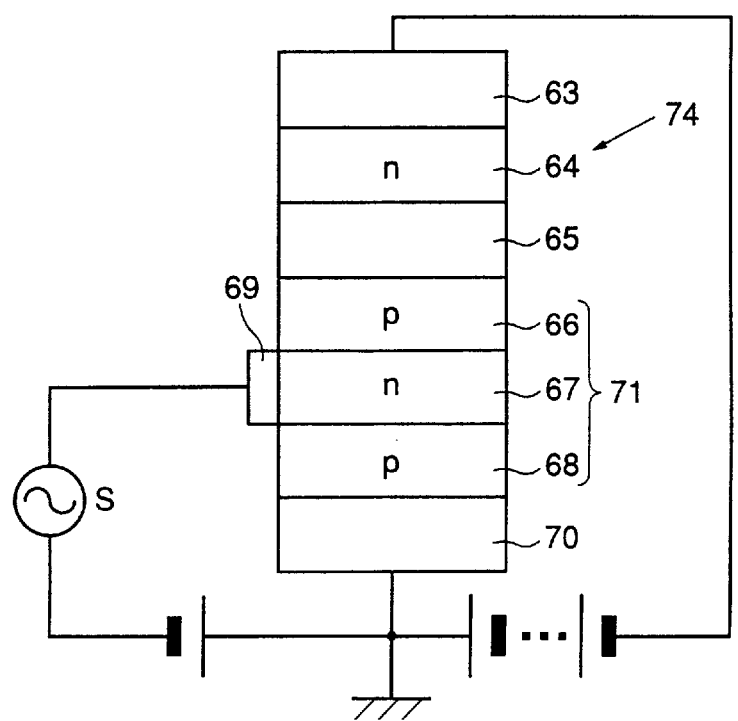
FIG. 9 is a model diagram showing the circuit structure of still another embodiment of the present invention.
Figure 10:
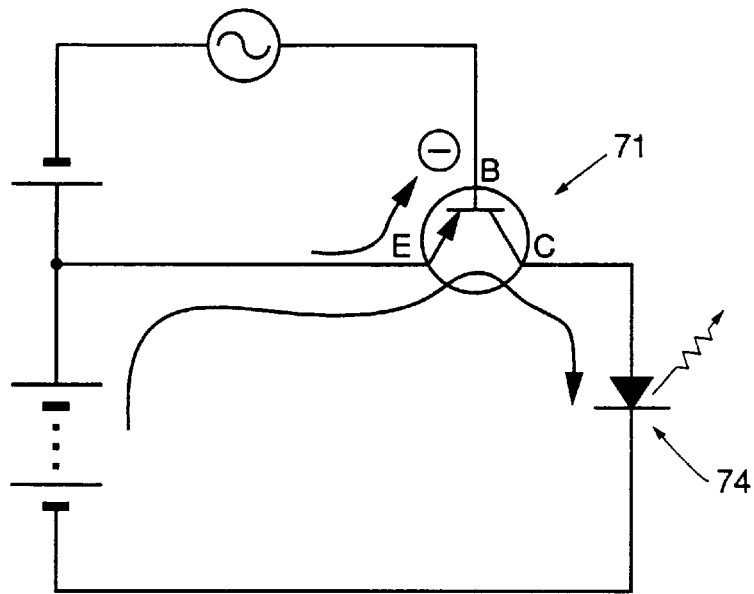
FIG. 10 is an equivalent circuit diagram with a bipolar transistor which is in an ON state.

FIG. 9 typically illustrates the circuit structure of an organic EL display unit according to still another embodiment of the present invention, and FIG. 10 shows an organic EL element 74 emitting light. In the embodiment shown in FIGS. 9 and 10, the display unit comprises a pnp transistor 71 and an organic EL element 74. Organic semiconductor layers and organic compound layers are stacked between a cathode 63 and an anode 70. The bipolar transistor 71 comprises an emitter region layer 68, a base region layer 67, a collector region layer 66 and a base electrode 69. The organic EL element 74 comprises an electron transport layer 64, a luminescent layer 65 and a hole transport layer 66. According to this embodiment, the collector region layer 66 of the bipolar transistor 71 and the hole transport layer 66 of the organic EL element 74 are formed by a common single layer.

The material for an organic compound forming the luminescent layer 65 may be changed in order to change the color of the light emitted from the organic EL element 74. Bebq2 (10-benzo[h]quinolinol-beryllium complex), OXD (oxadiazole) or AZM (azomethine-zinc complex), PYR (pyrazoline), Znq2 (8-quinolinol-zinc complex) and ZnPr (porphyrin-zinc complex) may be employed for emitting green light, blue light, blue-green light, yellow light and red light respectively. Thus, the organic EL display unit can make display in various colors.

Figure 11:
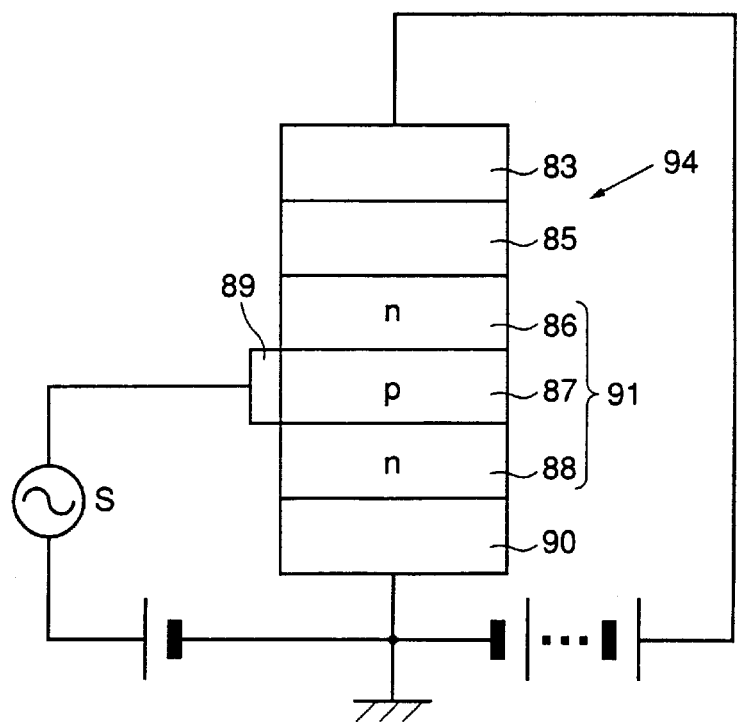
FIG. 11 is a model diagram showing the circuit structure of a further embodiment of the present invention.
Figure 13:
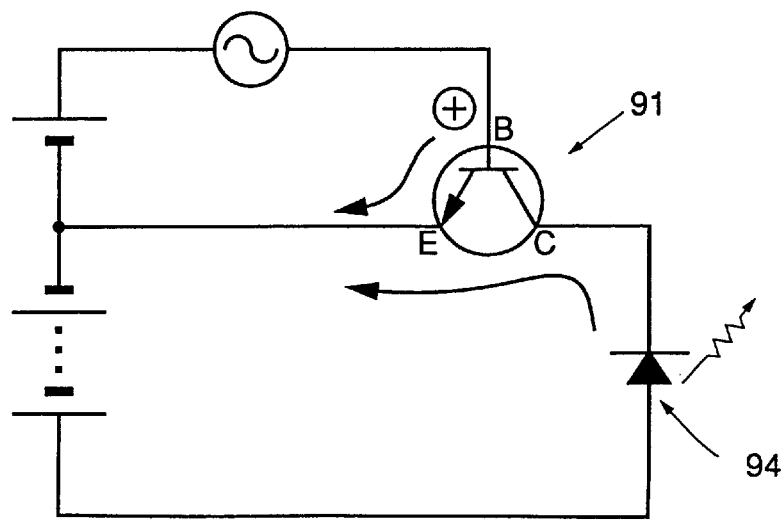
FIG. 13 is an equivalent circuit diagram with an npn bipolar transistor which is in an ON state.

FIG. 11 typically illustrates the circuit structure of an organic EL display unit according to a further embodiment of the present invention, and FIG. 13 shows a light emitting state of this embodiment. According to this embodiment, an organic EL element 94 has no hole transport layer. Excluding an anode 83 and a cathode 90, the organic EL element 94 has a two-layer structure of a luminescent layer 85 and an electron transport layer 86. An npn bipolar transistor 91 comprises an emitter region layer 88, a base region layer 87, a collector region layer 86 and a base electrode 89. According to this embodiment, the electron transport layer 86 of the organic EL element 94 and the collector region layer 86 of the bipolar transistor 91 are formed by a common single layer.

According to a further embodiment (not shown), an organic EL element may be provided with no electron transport layer. In this case, the organic EL element has a two-layer structure of a hole transport layer and a luminescent layer, excluding an anode and a cathode.

Figure 12:
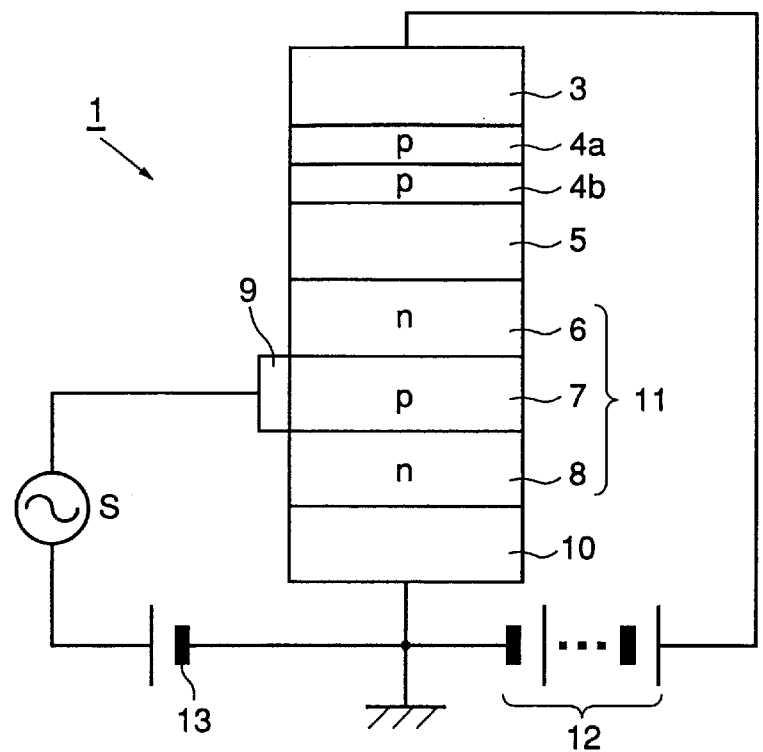
FIG. 12 is a model diagram showing the circuit structure of a further embodiment of the present invention.

FIG. 12 typically illustrates the circuit structure of an organic EL display unit according to a further embodiment of the present invention. This embodiment is different from that shown in FIG. 2 only in a point that a hole transport layer has a two-layer structure of first and second hole transport layers 4a and 4b. In this case, an organic electroluminescence element having extremely high luminous efficiency can be obtained for further improving the brightness of the organic EL display unit.

Figure 14:
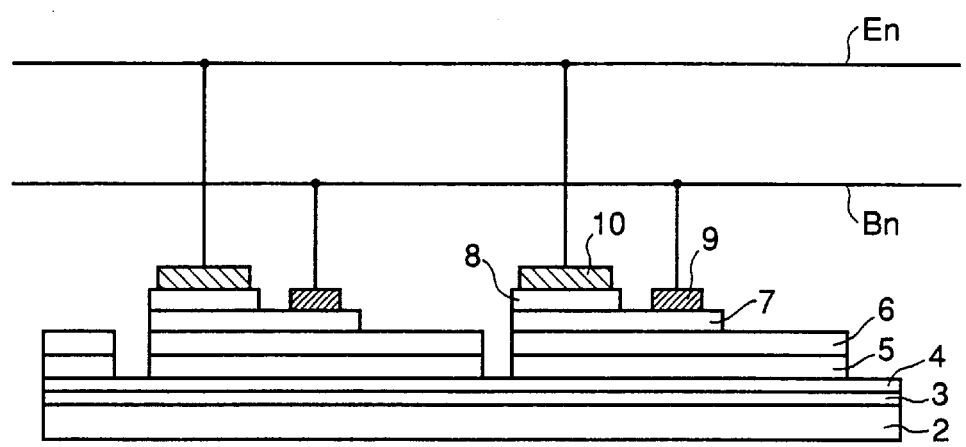
FIG. 14 is a sectional view of a further embodiment of the present invention.

FIG. 14 is a sectional view of a display unit having no storage capacitors according to a further embodiment of the present invention. This embodiment is different from that shown in FIG. 3 only in a point that no interlayer isolation films are provided between electron transport layers 6 and a hole transport layer 4. The remaining structure of this embodiment is identical to that of the embodiment shown in FIG. 3.

When no storage capacitors are provided, the number of fabrication steps for organic EL elements can be reduced, for contributing to cost reduction. In order to sufficiently hold charges, however, it is preferable to provide storage capacitors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A display unit comprising:

an organic electroluminescence element; and a transistor of an organic semiconductor stacked on said organic electroluminescence element for driving said organic electroluminescence element.

2. The display unit in accordance with claim 1, wherein said transistor is a bipolar transistor including a collector region of an organic semiconductor, said organic electroluminescence element includes a plurality of organic compound layers, and said collector region of said bipolar transistor and single said organic compound layer of said organic electroluminescence element are formed by a common single layer.

3. The display unit in accordance with claim 2, wherein said organic electroluminescence element comprises a luminescent layer and at least either one of a hole transport layer and an electron transport layer.

4. The display unit in accordance with claim 2, wherein said bipolar transistor includes an n-type collector region consisting of an organic semiconductor, said organic electroluminescence element includes an n-type electron transport layer, and said collector region and said electron transport layer are formed by the same layer.

5. The display unit in accordance with claim 2, wherein said bipolar transistor includes a p-type collector region consisting of an organic semiconductor, said organic electroluminescence element includes a p-type hole transport layer, and said collector region and said hole transport layer are formed by the same layer.

6. The display unit in accordance with claim 2, including a storage capacitor between said collector region of said bipolar transistor and single said organic compound layer of said organic electroluminescence element.

7. The display unit in accordance with claim 6, wherein said storage capacitor includes a dielectric layer of silicon nitride.

8. The display unit in accordance with claim 2, wherein said bipolar transistor transmits a current-amplified data signal to said organic electroluminescence element.

9. The display unit in accordance with claim 8, wherein said bipolar transistor is connected to a grounded-emitter circuit.

10. The display unit in accordance with claim 2, wherein said electroluminescence element comprises a hole transport layer having a two-layer structure of first and second hole transport layers.

11. A display unit comprising:

a transparent insulating substrate;

an organic electroluminescence element including a plurality of organic compound layers formed on said transparent insulating substrate; and a bipolar transistor including a plurality of organic semiconductor layers stacked on said organic electroluminescence element, said organic electroluminescence element including a hole transport layer, a luminescent layer and an electron transport layer, said bipolar transistor including a collector region layer, a base region layer and an emitter region layer.

12. The display unit in accordance with claim 11, wherein said bipolar transistor is an npn transistor, and said collector region layer and said electron transport layer are formed by a common single layer.

13. The display unit in accordance with claim 11, wherein said bipolar transistor is a pnp transistor, and said collector region and said hole transport layer are formed by a common single layer.

* * * * *